(12) United States Patent
Heine et al.

(10) Patent No.: US 9,917,226 B1
(45) Date of Patent: Mar. 13, 2018

(54) SUBSTRATE FEATURES FOR ENHANCED FLUIDIC ASSEMBLY OF ELECTRONIC DEVICES

(71) Applicant: Sharp Laboratories of America, Inc., Camas, WA (US)

(72) Inventors: David Robert Heine, Horseheads, NY (US); Sean Mathew Garner, Elmira, NY (US); Avinash Tukaram Shinde, Pune (IN)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/266,796

(22) Filed: Sep. 15, 2016

(51) Int. Cl.
| | | |
|---|---|---|
| *H01L 33/00* | (2010.01) | |
| *H01L 33/30* | (2010.01) | |
| *H01L 25/075* | (2006.01) | |
| *H01L 33/20* | (2010.01) | |
| *H01L 33/32* | (2010.01) | |
| *H01L 33/06* | (2010.01) | |

(52) U.S. Cl.
CPC ............ *H01L 33/005* (2013.01); *H01L 33/06* (2013.01); *H01L 33/32* (2013.01); *H01L 2933/0033* (2013.01)

(58) Field of Classification Search
CPC . H01L 2224/82085; H01L 2224/84085; H01L 2224/86085; H01L 2224/81085; H01L 2224/83085; H01L 2224/85085; H01L 2224/80085; H01L 2224/95085; H01L 33/382; H01L 33/32; H01L 33/385; H01L 33/387; H01L 2924/12041; H01L 25/13; H01L 25/075–25/0756; H01L 25/0753; H01L 24/95; H01L 2224/1152; H01L 2933/0033

USPC ................................................... 438/28, 286
See application file for complete search history.

(56) References Cited

U.S. PATENT DOCUMENTS

| | | | |
|---|---|---|---|
| 5,355,577 | A | 10/1994 | Cohn |
| 5,545,291 | A | 8/1996 | Smith et al. |
| 5,696,389 | A | 10/1997 | Ishikawa et al. |
| 5,904,545 | A | 5/1999 | Smith et al. |
| 6,527,964 | B1 | 3/2003 | Smith et al. |

(Continued)

FOREIGN PATENT DOCUMENTS

| | | |
|---|---|---|
| JP | 2007-294566 | 11/2001 |
| JP | 2006-278511 | 10/2006 |
| JP | 11-186590 | 7/2007 |

OTHER PUBLICATIONS

Morris et al "Self-assembly for microscale and nanoscale packaging: steps toward self-packaging", IEEE Trans. Adv. Packag., 2005, 28, 600-611.

(Continued)

*Primary Examiner* — Evan Pert
*Assistant Examiner* — Changhyun Yi
(74) *Attorney, Agent, or Firm* — Hamilton, DeSanctis & Cha

(57) ABSTRACT

Embodiments are related to systems and methods for fluidic assembly, and more particularly to systems and methods for assuring deposition of elements in relation to a substrate. In some cases, embodiments include a substrate including a plurality of wells each having a sidewall where a through hole via extends from a bottom of at least one of the plurality of wells; and a post enhanced diode including a post extending from a top surface of a diode structure.

20 Claims, 8 Drawing Sheets

(56) References Cited

U.S. PATENT DOCUMENTS

| | | | |
|---|---|---|---|
| 6,566,744 B2 | 5/2003 | Gengel | |
| 6,623,579 B1 | 9/2003 | Smith et al. | |
| 6,771,019 B1 | 8/2004 | Wu et al. | |
| 6,821,805 B1 | 11/2004 | Nakamura et al. | |
| 6,927,382 B2 | 8/2005 | King et al. | |
| 7,528,422 B2 | 5/2009 | Murphy | |
| 7,589,355 B2 | 9/2009 | Tomoda et al. | |
| 7,687,277 B2 | 3/2010 | Sharma et al. | |
| 7,727,788 B2 | 6/2010 | Han et al. | |
| 7,727,804 B2 | 6/2010 | Smith | |
| 7,874,474 B2 | 1/2011 | Kim et al. | |
| 7,928,655 B2 | 4/2011 | Lin et al. | |
| 7,931,063 B2 | 4/2011 | Craig et al. | |
| 8,076,178 B2 | 11/2011 | Krishnamoorthy et al. | |
| 8,318,595 B2 | 11/2012 | Morris et al. | |
| 8,426,277 B2 | 4/2013 | Bibi et al. | |
| 8,516,683 B2 | 8/2013 | Credelle et al. | |
| 8,552,436 B2 | 10/2013 | Bibl et al. | |
| 8,629,465 B2 | 1/2014 | Yu et al. | |
| 8,648,328 B2 | 2/2014 | Crowder et al. | |
| 8,685,774 B2 | 4/2014 | Crowder et al. | |
| 2002/0041149 A1 | 4/2002 | Shimoda et al. | |
| 2003/0057444 A1 | 3/2003 | Niki et al. | |
| 2005/0164485 A1* | 7/2005 | Onozawa | H01L 24/95 438/616 |
| 2007/0031992 A1 | 2/2007 | Schatz | |
| 2007/0092654 A1 | 4/2007 | Smith et al. | |
| 2007/0120463 A1 | 5/2007 | Hayashi et al. | |
| 2007/0224713 A1 | 9/2007 | Han et al. | |
| 2008/0036038 A1 | 2/2008 | Hersee et al. | |
| 2010/0075463 A1 | 3/2010 | Smith et al. | |
| 2010/0163895 A1 | 7/2010 | Horie | |
| 2010/0276664 A1 | 11/2010 | Hersee | |
| 2011/0031516 A1 | 2/2011 | Basin et al. | |
| 2013/0161584 A1 | 6/2013 | Crowder et al. | |
| 2013/0161643 A1 | 6/2013 | Crowder et al. | |
| 2014/0008696 A1 | 1/2014 | Kim et al. | |
| 2014/0077158 A1 | 3/2014 | Crowder et al. | |
| 2014/0355931 A1 | 12/2014 | Tummala et al. | |
| 2015/0060402 A1 | 3/2015 | Burkett et al. | |
| 2015/0140721 A1 | 5/2015 | Moslehi et al. | |
| 2015/0155445 A1 | 6/2015 | Zhan et al. | |
| 2015/0166396 A1 | 6/2015 | Marjanovic et al. | |
| 2015/0214430 A1* | 7/2015 | Zhan | H01L 33/20 257/13 |

OTHER PUBLICATIONS

Boncheva "Millimeter-scale self-assembly and its applications", Pure Appl. Chem., 75, No. 5, pp. 621-630, 2003.

Mastrangeli et al "Self-assembly from milli- to nanoscales: methods and applications" J. Micromech. Microeng., 2009,19, 083001, (37 PP).

Yeh "Fluidic self-assembly for the integration of GaAs light-emitting diodes on Si substrates", IEEE Photonics Technol. Lett., 1994, 6, 706-708.

Tien "Microfabrication through electrostatic self-assembly", Langmuir, 1997, 13, 5349-5355.

Snyder et al "Fluidic self-assembly of semiconductor devices: a promising new method of mass-producing flexible circuitry", Jpn. J. Appl. Phys., 2002,41,4366-4369.

Chung, Programmable reconfigurable self-assembly: parallel heterogeneous integration of chip-scale components on planar and nonplanar surfaces, J. Microelectromech. Syst., 2006.

Stauth "Self-assembled single-crystal silicon circuits on plastic", Proc. Natl. Acad. Sci. U. S. A., 2006, 103, 13922-13927.

Saeedi et al "Self-assembled single-digit micro-display on plastic", Proc. of SPIE, 2008, 6885, 688509.

Park "Orientation-specific self-assembly at air-water interface using magnetic field", Transducers'11, Beijing, China, Jun. 5-9, 2011, 866-869.

Tkachenko "Evaluation of directed self-assembly process for LED assembly on flexible substrates", Electronic Components & Technology Conference (ECTC), 2013 IEEE 63rd.

Nakagawa "Controlled deposition of silicon nanowires on chemically patterned substrate by capillary force using a blade-coating method", J. Phys. Chem. C, 2008,112, 5390-5396.

Arase, "Interfacial-energy-controlled deposition technique of microstructures using blade-coating", J. Phys. Chem. B, 2009, 113, 15278-15283.

Nakagawa "Interfacial-force-controlled placing technique of microstructures of sub- to one hundred micrometer size using blade coating", Jpn. J. Appl. Phys., 2011, 50, 01BJ109.

Arase, "Fluidic self-assembly of microstructures using a blade-coating technique" Jpn J. Appl. Phys., 2012, 51, 036501.

Nordquist et al., "An Electro-Fluidic Assembly Technique for Integration of III-V Devices onto Silicon" IEEE International Symposium on Compound Semiconductors, Proc. 2000.

Khare et al "Via Hole Formation in Semi-Insulating InP Using Wet Photoelectrochemical Etching" Indium Phosphide and Related Materials, 1993. Conference proceedings.

Brusberg et al, "Thin Glass Based Packaging Technologies for Optoelectronic Modules" Electronic Components and Technology Conference, 2009.

Kim et al Large Scale Self-assembly of crystalline semiconductor microsomponents onto plastic substrates via microfluidic traps 4th IEEE Conf. on Automation (2008).

Xiao et al "Fluidic assisted thin-film device heterogeneous integration: surface tension as driving force and magnetic as guiding force" Science Direct (2015).

Yeh et al, "New fabrication technique for the integration of large area optoelectronic display panels" OSA/CLEO (1994).

Varna et al "Fluidic self-assembly of silicon microstructures" University of CA Berkley (1995).

Talghader Integration of LEDs and VCSELs using fluidic self-assembly (SPIE vol. 3286, p. 86).

Zheng et al, "Self-assembly process to integrate and connect semiconductor dies on surfaces with single-angular orientation and contact pad registration" Adv. Mater. (2006,18).

Park et al "A First Implementation of an Automated Reel-to-Reel Fluidic Self-Assembly Machine" Adv. Mater. vol. 26, No. 34, 9/14 Available online Jun. 2014.

Park et al "Printed Assemblies of Inorganic Light-Emitting Diodes for Deformable and Semitransparent Displays" Aug. 2009 www.sciencemag.org.

Jacobs et al "Fabrication of a Cylindrical Display by Patterned Assembly" Science, vol. 296, Apr. 2002.

Chung et al "Guided and Fluidic Sell-Assembly of Microstructures Using Railed Microfluidic channels" Pub. online Jun. 15, 2008.

* cited by examiner

US 9,917,226 B1

SUBSTRATE FEATURES FOR ENHANCED FLUIDIC ASSEMBLY OF ELECTRONIC DEVICES

FIELD OF THE INVENTION

Embodiments are related to systems and methods for fluidic assembly, and more particularly to systems and methods for assuring deposition of elements in relation to a substrate.

BACKGROUND

LED displays, LED display components, and arrayed LED devices include a large number of diodes formed or placed at defined locations across the surface of the display or device. Forming or placing such a large number of diodes often results in low throughput or in a number of defects which reduce the yield of a display or device manufacturing process. Some approaches to increasing throughput and yield include adding additional diodes per pixel to provide enough redundancy to ensure that at least a sufficient number of diodes per pixel are properly formed. This type of approach offers enhanced yield, but without adding a large number of redundant diodes per pixel, display yields are often still lower than desired. Any yield less than one hundred percent within a display is costly both in an impact on profits and an impact on manufacturing throughput.

Hence, for at least the aforementioned reasons, there exists a need in the art for advanced systems and methods for manufacturing LED displays, LED display components, and LED devices.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components (e.g., 142a, 142b, 142c, 142d, 142e, 142f, 120a, 130a, 130b, 130c, 130d, 130e, 130f, 130g of FIG. 1; 205a, 205b, 205c, 205d, 205e, 205f, 205g, 205h, 205i, 205j, 205k, 205l, 205m, 205n, 205o, 205p, 205q, 205r, 205s, 205t, 205u, 205v, 205w, 205x, 205y, 205z, 205aa, 205bb, 205cc, 205dd, 205ee, 205ff, 205gg, 205hh, 205ii, 205jj, 210a, 210b, 210c, 210d, 210e, 210f, 210g, 210h, 210i, 210j, 210k, 210l, 210m, 210n, 210o, 210p, 210q, 210r, 210s, 210t, 210u, 210v, 210w, 210x, 210y, 210z, 210aa, 210bb, 210cc, 210dd, 210ee, 210ff, 210gg, 210hh, 210ii, 210jj of FIG. 2; 305a, 305b, 305c, 305d, 305e, 305f, 310a, 310b, 310c, 310d, 310e, 310f of FIG. 3; 405a, 405b, 405c, 405d, 405e, 405f, 410a, 410b, 410c, 410d, 410e, 410f of FIG. 4a; and 505a, 505b, 505c, 505d, 505e, 505f, 510a, 510b, 510c, 510d, 510e, 510f, 560a, 560b, 560c, 560d, 560e, 560f, 561a, 561b, 561c, 561d, 561e, 561f of FIG. 5a). When reference is made to a reference numeral without specification to an existing sub-label, it is intended to refer to all such multiple similar components.

DETAILED DESCRIPTION OF SOME EMBODIMENTS

Figure 1:
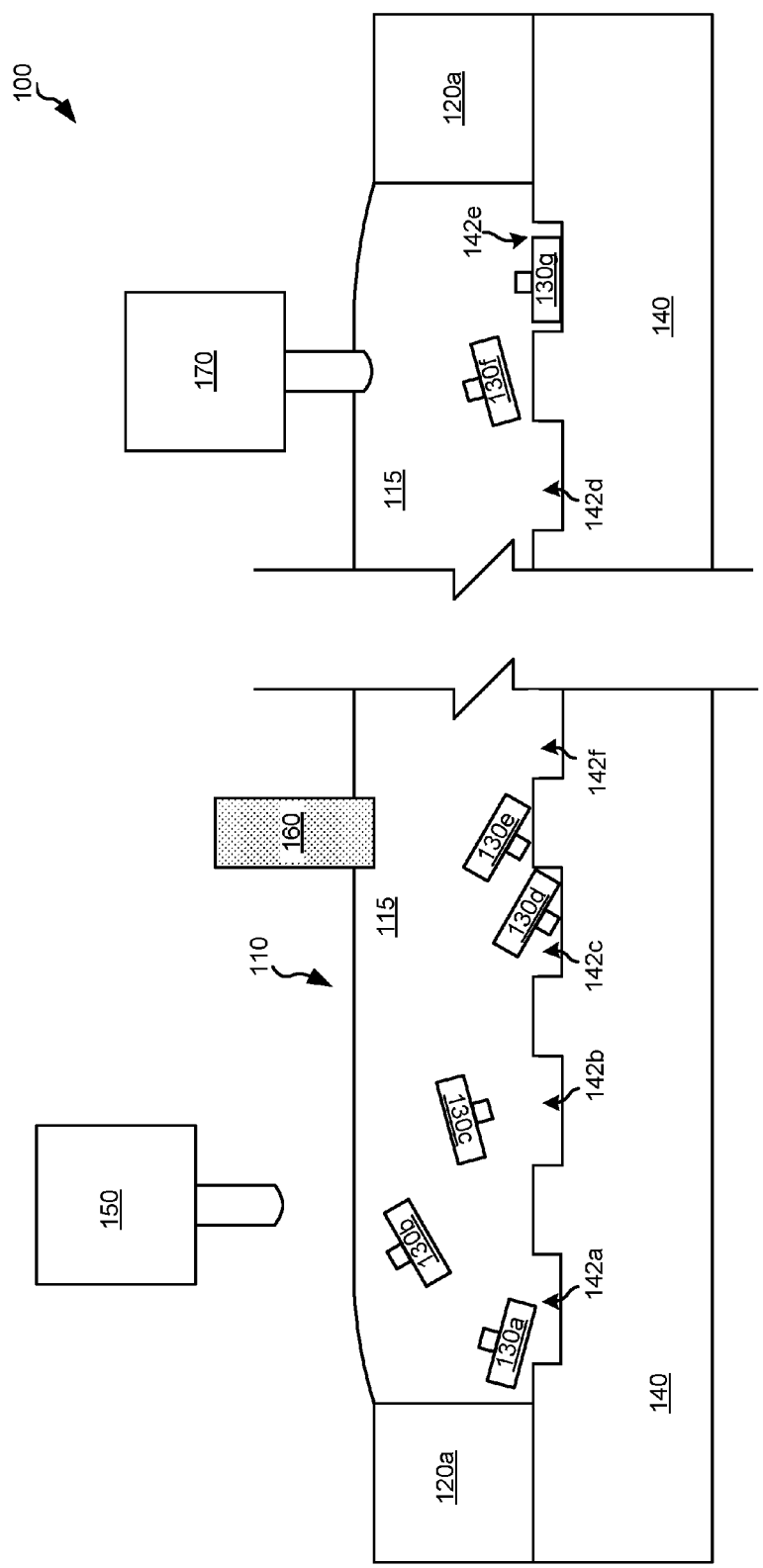
FIG. 1 depicts a fluidic assembly system capable of moving a suspension composed of a carrier liquid and a plurality of post enhanced diodes relative to the surface of a substrate in accordance with one or more embodiments of the present inventions.

Embodiments are related to systems and methods for fluidic assembly, and more particularly to systems and methods for assuring deposition of elements in relation to a substrate.

Some embodiments of the present inventions provide fluidic assembly systems that include a substrate having a plurality of wells each with a sidewall. A through hole via extends from a bottom of at least one of the plurality of wells. The systems further include a post enhanced diode including a post extending from a top surface of a diode structure, where the post is incapable of insertion in the through hole via when the post enhanced diode is deposited in the at least one of the plurality of wells.

In some instances of the aforementioned embodiments, a width of the through hole via is less than a width of the post. In one or more instances of the aforementioned embodiments, the through hole via is offset from the post such that when the post enhanced diode is deposited in the well in an inverted orientation the post is incapable of insertion in the through hole via. In some such instances, the through hole via is offset from a center location of the bottom of the at least one of the plurality of wells. In other such instances, the post is offset from a center location of the top surface of the diode structure. In various instances of the aforementioned embodiments, the through hole via extends from an out of boundary area of the at least one of the plurality of wells, where the out of boundary area incapable of being fully covered by the diode structure when the post enhanced diode is deposited in the well in a non-inverted orientation. In one particular case, the well has a tear drop shape including a circular region and a triangular region, and the out of boundary area includes a portion of the triangular region.

In some instances of the aforementioned embodiments, the sidewall is a sloping sidewall. In various instances of the aforementioned embodiments, the well has a polygonal shape. In some instances of the aforementioned embodiments, the at least one of the plurality of wells is a first well that is joined with a second well to make a multi-well structure. In some such instances, the post enhanced diode may be deposited in a non-inverted orientation in the first well such that it cannot move into the second well without being completely removed from the first well. In one or more such instances, the post enhanced diode may be deposited in a non-inverted orientation in the first well but is incapable of being deposited in the second well in the non-inverted orientation.

Yet other embodiments provide fluidic assembly systems that include a substrate having a plurality of polygonal wells where each of the polygonal wells has a sidewall and is sized to accept a single disk shaped device. In some cases, the disk shaped device is a diode structure. In various cases, the side wall of at least one of the polygonal wells is a sloped sidewall that differentially limits removal of the disk shaped device from the well depending upon orientation of the disk shaped device.

Yet further embodiments of the present inventions provide methods for forming a fluidic assembly substrate. The methods include: receiving a post dimension of a post enhanced diode; providing a substrate material having a top surface and a bottom surface; and forming a plurality of wells in the substrate material. Each of the plurality of wells extends only partially into the substrate material where a through hole via extends from a bottom of at least one of the plurality of wells through to the bottom surface of the substrate material. The through hole via is formed based upon the post dimension such that a post of the post enhanced diode is incapable of insertion into the through hole via.

Turning to FIG. 1, a fluidic assembly system 100 capable of moving a suspension 110 composed of a carrier liquid 115 and a plurality of post enhanced diodes 130 relative to the surface of a substrate 140 is shown in accordance with one or more embodiments of the present inventions. In some embodiments, substrate 140 is formed of a polymer material laminated to the surface of a glass substrate. In particular embodiments, wells 142 are etched or otherwise formed in the laminate layer. As used herein, the term "well" is used in its broadest sense to mean any surface feature into which a post enhanced diode may be deposited. In other embodiments, the substrate is made of glass with wells 142 directly formed into the glass. Wells 142 may have flat and vertical surfaces as shown, or they may have bottoms and sides with complex curvatures. Based upon the disclosure provided herein, one of ordinary skill in the art will recognize a variety of materials, processes, and/or structures that may be used to form substrate 140. For example, substrate 140 can be formed of any material or composition compatible with fluidic device processing. This can include, but is not limited to, glass, glass ceramic, ceramic, polymer, metal, or other organic or inorganic materials. As examples, wells 142 can be defined in a single material forming a surface feature layer when applied to the surface of a base glass sheet. It is also possible for patterned conductor layers to exist between wells 142 formed in such a surface feature layer and the base glass layer. Substrate 140 can also be made of multiple layers or combinations of these materials. Substrate 140 may be a flat, curved, rigid, or flexible structure. Substrate 140 may exhibit a thickness of between 10 µm and 1 mm. In some cases, substrate 140 may end up being the final device substrate or it may only serve as an assembly substrate to position post enhanced diodes 130. In the case of an assembly substrate, post enhanced diodes 130 would then be transferred to the final device substrate in subsequent steps.

In some embodiments, carrier liquid 115 is isopropanol. Based upon the disclosure provided herein, one of ordinary skill in the art will recognize a variety of liquids, gasses, and/or liquid and gas combinations that may be used as the carrier liquid. It should be noted that various analysis provided herein is based upon flow in a single, continuous direction or in other cases a relatively simple back-forth motion, but that the flow may be more complex where both the direction and magnitude of fluid velocity can vary over time.

As shown in FIG. 1, post enhanced diodes 130 each include a relatively large diode structure and a smaller post extending from a top surface of the diode structure, and wells 142 in substrate 140 are each capable of receiving a given post enhanced diode 130 in a non-inverted orientation. As used herein, the phrase "post enhanced diode" is used broadly to mean any device with a post extending from a surface of either an anode or cathode of a diode structure such that at least a portion of an outer edge of the post is set back from an edge of the diode structure. As used herein the phrase "non-inverted orientation" is used in its broadest sense to mean any orientation of a post enhanced diode 130 with the post extending generally away from the top surface of substrate 140 (i.e., away from the bottom of wells 142); and as used herein the phrase "inverted orientation" is used in its broadest sense to mean any orientation of a post enhanced diode 130 with the post extending generally toward the top surface of substrate 140 (i.e., toward from the bottom of wells 142). Using these definitions, post enhanced diodes 130a, 130b, 130f, and 130g are each in a non-inverted orientation; and post enhanced diodes 130c, 130d, and 130e are each in an inverted orientation. The diode structure and post of post enhanced diodes 130 are discussed in greater detail below in relation to FIGS. 2a-2e. It should be noted that in some cases the diode structure including an anode on one side and a cathode on the other can be referred to as asymmetric due to the different materials on each side of the diode structure, however, the use of the term "asymmetric" in relation to a diode herein refers to any asymmetry of forces generated by liquid movement around a post enhanced diode between an inverted orientation and a non-inverted orientation due to a post extending from the diode structure. In some cases, the depth of wells 142 is substantially equal to the height of the diode structure of each of the post enhanced diodes 130, and the inlet opening of wells 142 is greater that the width of the diode structure of each of the post enhanced diodes 130 such that only one post enhanced diode 130 deposits into any given well 142. It should be noted that while embodiments discuss post enhanced diodes that include a single post extending from a diode structure, that various embodiments provide post enhanced diodes that each include two or more posts each extending from the same diode structure.

A depositing device 150 deposits suspension 110 over the surface of substrate 140 with suspension 110 held on top of substrate 140 by sides 120 of a dam structure. In some embodiments, depositing device 150 is a pump with access to a reservoir of suspension 110. A suspension movement device 160 agitates suspension 110 deposited on substrate 140 such that post enhanced diodes 130 move relative to the surface of substrate 140. As post enhanced diodes 130 move relative to the surface of substrate 140 they deposit into wells 142 in either a non-inverted orientation or an inverted orientation. In some embodiments, suspension movement device 160 is a brush that moves in three dimensions. Based upon the disclosure provided herein, one of ordinary skill in the art will recognize a variety of devices that may be used to perform the function of suspension movement device 160 including, but not limited to, a pump.

When deposited in the inverted orientation (e.g., post enhanced diode 130d), the movement generated by suspension movement device 160 generates force likely to dislocate an inverted post enhanced diode 130 from a given well 142. In contrast, when deposited in the non-inverted orientation (e.g., post enhanced diode 130g), the force on the deposited, non-inverted post enhanced diode 130 caused by suspension movement device 160 is unlikely to dislocate the post enhanced diode from a given well 142. In some embodiments, the likelihood of dislocating an inverted post enhanced diode 130 from a well 142 is much greater than the likelihood of dislocating a non-inverted post enhanced diode 130 from a well 142. In some embodiments the moment of force required to dislocate an inverted post enhanced diode 130 from a well 142 is between $0.01 \times 10^{-14}$ N-m and $1.0 \times 10^{-14}$ N-m depending upon the width to height ratio of the post and the diameter of the diode structure (where a positive value of the moment of force indicates the diode structure of a post enhanced diode 130 is being forced to rotate about a point of rotation); and the moment of force required to dislocate a non-inverted post enhanced diode 130 from a well 142 is a negative value (where a negative value of the moment of force indicates the diode structure of a post enhanced diode 130 is being pushed down on the surface of substrate 140) for the same width to height ratio of the post and thickness of the diode structure making any displacement unlikely. As used herein, a post enhanced diode is considered "likely to dislocate" where the moment of force is a positive value, and is considered "unlikely to dislocate" where the moment of force is a negative value.

Similarly, when moving across the surface of substrate 140 in the inverted orientation (e.g., post enhanced diode 130e), the movement generated by suspension movement device 160 generates a force likely to flip an inverted post enhanced diode 130. In contrast, when moving across the surface of substrate 140 in the non-inverted orientation (e.g., post enhanced diode 130O), the force on the non-inverted post enhanced diode 130 caused by suspension movement device 160 is less likely to flip the post enhanced diode. In some embodiments, the likelihood of flipping an inverted post enhanced diode 130 moving near the surface of substrate 140 is greater than the likelihood of flipping a non-inverted post enhanced diode 130 moving similarly near the surface of substrate 140 as the moment of force for the inverted post enhanced diode 130 is greater than the moment of force for the non-inverted post enhanced diode 130.

A capture device 170 includes an inlet extending into suspension 110 and capable of recovering a portion of suspension 110 including a portion of carrier liquid 115 and non-deposited post enhanced diodes 130, and returning the recovered material for reuse. In some embodiments, capture device 170 is a pump.

It should be noted that while embodiments discussed herein are discussed in relation to post enhanced diodes, other components may be used in relation to the discussed wells and well features. For example, plate diodes that do not include a post extending there from may be used. As another example, a non-diode having a post extending from a plate structure may be used. Based upon the disclosure provided herein, one of ordinary skill in the art will recognize other components, electronic and otherwise, that may be used in relation to the wells and well features disclosed herein.

Figure 2A:
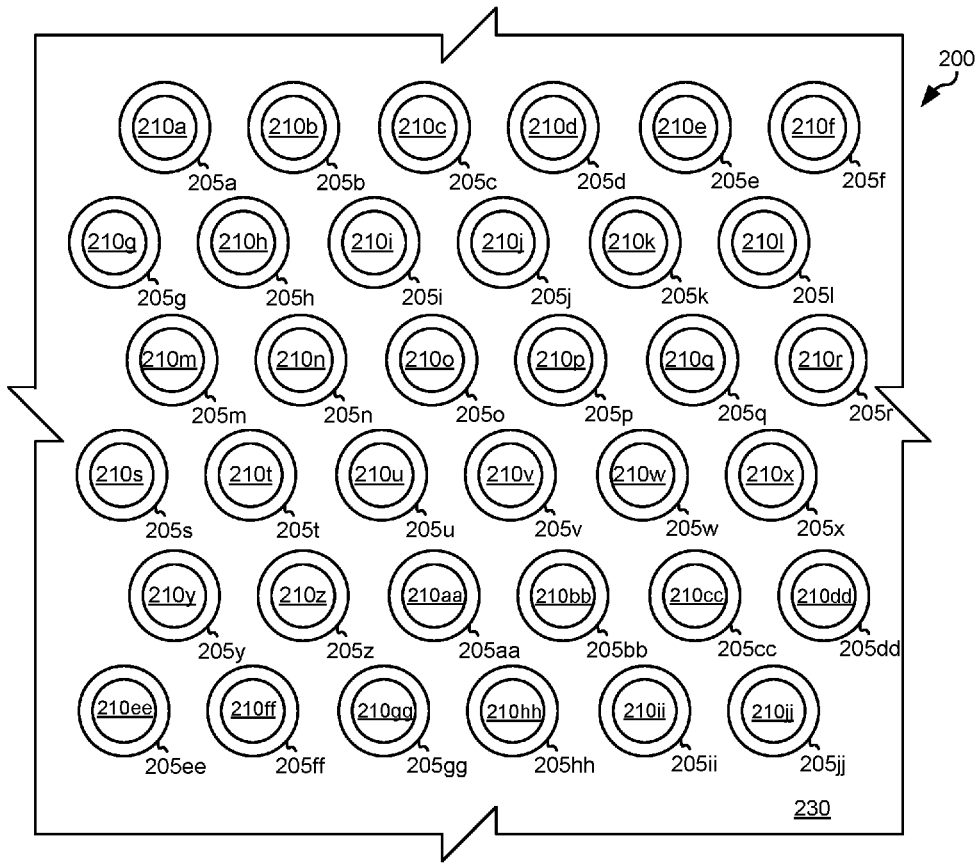
FIGS. 2a-2e show a portion of a display including a substrate having a number of wells each filled with a respective post enhanced diode in accordance with embodiments of the present inventions.

Turning to FIG. 2a, a top view 200 of a substrate portion 230 is shown including a number of wells 205 into which post enhanced diodes 210 have been successfully deposited. Each of post enhanced diodes 210 of FIG. 2a are represented in a top view 235 of FIG. 2b, a cross-sectional view 250 of FIG. 2c, and a circuit symbol 280 of a post enhanced diode 210 operating as an LED. Post enhanced diodes 210 include one or more features that enable the relative flow of a carrier liquid about post enhanced diodes 210 to create a net moment of force for increasing a likelihood of flipping post enhanced diodes 210 from a first orientation to a second orientation, with a dissimilar (i.e., asymmetric) likelihood of flipping post enhanced diodes 210 from the second orientation to the first orientation. These features may include sidewall angles, surface structures such as posts, or the general shape of the post enhanced diodes 210. Notably, the aforementioned structures and shapes of the post enhanced diodes 210 that encourage asymmetric re-orientation may or may not be present in a final display incorporating post enhanced diodes 210.

Figure 2B:
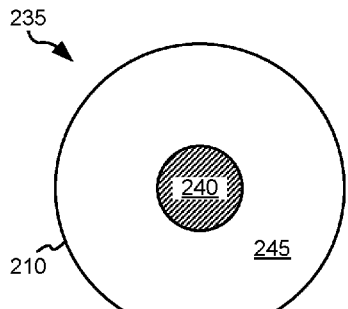
Figure 2C:
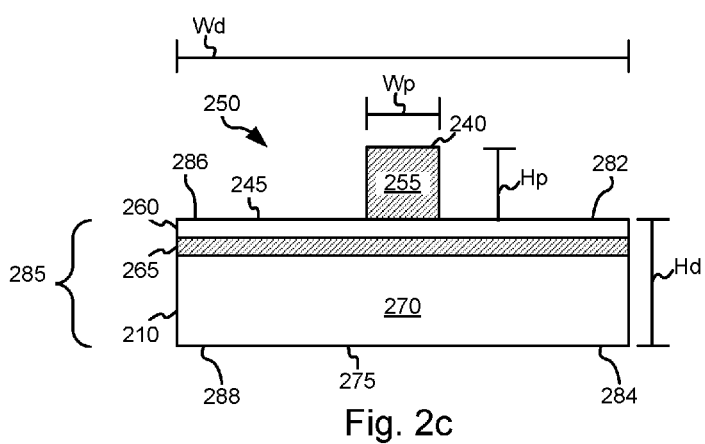
Figure 2D:
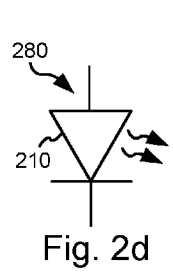

As shown in FIGS. 2b-2c, post enhanced diode 210 includes a planar top surface 245 of an electrically conductive material 260 (shown as an un-patterned region). As used herein, the term "planar" is used in its broadest sense to mean two dimensional with exception of defects or process related variance standard in semiconductor manufacturing processes. In some embodiments, electrically conductive material 260 is p-doped Gallium Nitride (GaN). A post 255 (show as a hatched pattern region) extending from top surface 245 is also shown. A top surface 240 of post 255 is also shown. In some embodiments, post 255 is formed of electrically conductive material 260 (i.e., a homogeneous post). In other embodiments, post 255 is formed of a material other than electrically conductive material 260 (i.e., a heterogeneous post). In some cases, a heterogeneous post is formed at least in part of an insulating layer such as $SiO_2$, and in other cases a heterogeneous post is formed of a conductive material such as a metal compatible with deposition on electrically conductive material 260. It should be noted that while post 255 is shown as substantially centered on top surface 245, in other embodiments post 255 may be offset from a center position at any location from a center point of top surface 245 to a radial distance from the center point such that a portion, but not all of the edges, of post 255 is coextensive with an edge of a diode structure 285. In some cases the post can have a rounded top surface or surface with complex curvature, and in other cases it can have a substantially flat top surface. In other cases, multiple posts may exist on the diode top surface.

Various approaches may be used for forming post 255 on diode structure 285. For example, fabricating a homogeneous post may include etching the top surface of a thick layer of electrically conductive material 260 to yield the combination of both post 255 and the layer of electrically conductive material 260 shown in cross-sectional view 250; or by forming the layer of electrically conductive material 260 followed by selective epitaxial growth using the same material to form post 255. As other examples, fabricating a heterogeneous post may include etching the post from a film that is deposited onto top surface 245 of diode structure 285, or by forming a post with a different material through plating or a templated growth process on top of top surface 245 of diode structure 285. This latter approach permits the use of any material for the post (e.g., dielectrics, metals, etc.). In some cases, photolithography of a photo resist may be used in relation to the aforementioned plating or template growth.

Top surface 245 includes one or more electrical contacts 282, 286 that conduct charge from a signal source (not shown) to electrically conductive material 260. In some embodiments, electrical contacts 282, 286 are formed of a metal deposited onto the layer of electrically conductive material 260. In other embodiments, electrical contacts 282, 286 are an exposed area of top surface 245 to which a signal source (not shown) can contact electrically conductive material 260. In some embodiments where post 255 is formed of a conductive material it operates as a post. In one particular embodiment where post 255 is formed of electrically conductive material 260, an exposed area of top surface 240 to which a signal source (not shown) can contact electrically conductive material 260 operates as an electrical contact.

The layer of electrically conductive material 260 is disposed on top of a multiple quantum well (MQW) 265 (shown as a hatched pattern region), which in turn is disposed on top of a layer of an electrically conductive material 270 (shown as an un-patterned region). In some embodiments, electrically conductive material 270 is n-doped Gallium Nitride (GaN). MQW 265 may be formed of any material compatible with both electrically conductive material 260 and electrically conductive material 270, and which when sandwiched between electrically conductive material 260 and electrically conductive material 270 is capable of operating as a light emitting diode (LED). Together, the layer of electrically conductive material 260, MQW 265, and the layer of electrically conductive material 270 form a diode structure of post enhanced diodes 210. Based upon the disclosure provided herein, one of ordinary skill in the art will recognize a variety of materials and material combinations that may be used in forming diode structure 285 of a given post enhanced diode 210. As different post enhanced diodes 210 are intended to emit light of different wavelengths (e.g., red, green, blue), the construction and/or materials for different instances of post enhanced diodes 210 will vary to achieve a desired color distribution.

The layer of electrically conductive material 270 includes a planar bottom surface 275. Bottom surface 275 includes one or more electrical contacts 284, 288 that conduct charge from a signal source (not shown) to electrically conductive material 270. In some embodiments, electrical contacts 284, 284 are formed of a metal deposited onto the layer of electrically conductive material 270. In other embodiments, electrical contacts 284, 288 are an exposed area of bottom surface 275 to which a signal source (not shown) can contact electrically conductive material 270. In particular cases, electrical contacts 284, 288 are two sides of the same contact extending as a concentric circle of exposed electrically conductive material 270 around the perimeter of bottom surface 275.

Post 255 has a width (Wp) and a height (Hp), and diode structure 285 has a width (Wd) and a height (Hd). As more fully discussed below in relation to FIG. 2e, the sides of post 255 and diode structure 285 in some cases are not perfectly vertical and may vary. In such a case, the aforementioned width and height characteristics of post 255 and diode structure 285 are considered to be: the maximum width where the width varies as a function of height, and the maximum height where the height varies as a function of width. In some embodiments, the width:height ratio of diode structure 285 (i.e., Wd:Hd) is between 5:1 and 50:1. In some particular embodiments, the width:height ratio of diode structure 285 (i.e., Wd:Hd) is between 5:1 and 30:1. In some embodiments, the width:height ratio of post 255 (i.e., Wp:Hp) is between 2:1 and 5:1. In various embodiments, the height of diode structure 285 (i.e., Hd) is between 4 μm and 7 μm, and the height of post 255 (i.e., Hp) is between 2 μm and 7 μm, in part depending upon the desired ratio of Hd to Hp.

The dimensions of post 255 can affect the stability of an inverted post enhanced diode 210. In particular, if the post is too small, post enhanced diode 210 will not be as likely to flip into a non-inverted orientation. Numerical modeling of the fluidic process shows that, for a 50-m-diameter (Wd) diode structure that is 5 μm thick (Hd) exposed to a flow velocity of a carrier liquid of 4.6 mm/s, a post with dimensions of 10 μm×5 μm (Wp×Hp) will flip the disk to the non-inverted orientation. Models with varying post dimensions on a 50-μm-diameter (Wd) disk diode structure that are captured in a 3 μm deep well have shown that small posts (e.g., with a height (Hp) less than or equal to 4 μm) exposed to a similar flow velocity as above, have little influence on the orientation, but a 5-μm high (Hp) post is sufficient to cause an inverted post enhanced diode 210 to flip while a non-inverted post enhanced diode 210 will remain in a non-inverted orientation. Experimental data has demonstrated that the modeling revealing the aforementioned dimensions is reliable, and that a post with dimensions of 12 μm×3 μm (Wp×Hp) is able to influence the orientation of fluidically-aligned disks, with a yield of over 99.7% of disks (out of 150 disks) having a desired non-inverted orientation. The following table shows additional modeling data for the net moment of force for inverted post enhanced diodes 210 having different diode structure widths (Wd) and ratios of post height to width (Hp×Wp):

|  | Wp × Hp = 10 × 5 | Wp × Hp = 15 × 5 | Wp × Hp = 20 × 5 | Wp × Hp = 20 × 7 |
| --- | --- | --- | --- | --- |
| Wd = 40 μm | $+0.29 \times 10^{-14}$ N-m | — | — | — |
| Wd = 50 μm | $+0.52 \times 10^{-14}$ N-m | — | — | — |
| Wd = 70 μm | $-0.29 \times 10^{-14}$ N-m | $-0.11 \times 10^{-14}$ N-m | $+0.07 \times 10^{-14}$ N-m | — |
| Wd = 90 μm | $-1.57 \times 10^{-14}$ N-m | $-1.33 \times 10^{-14}$ N-m | $-1.13 \times 10^{-14}$ N-m | $+0.09 \times 10^{-14}$ N-m |

Figure 2E:
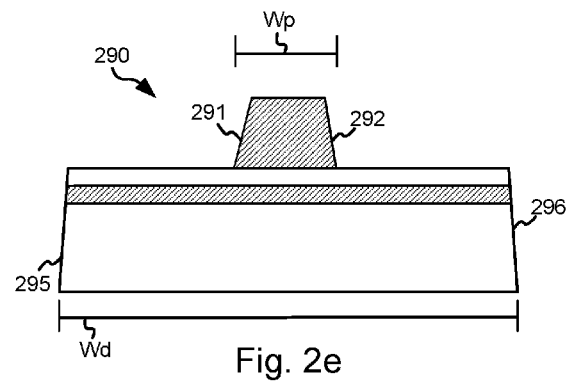

Turning to FIG. 2e, a cross-sectional view 290 of another embodiment of a post enhanced diode 210 where sidewalls 291, 292 of post 255 and sidewalls 295, 296 of diode structure 285 each exhibit a tapered slope compared with the vertical slope shown in cross-sectional view 250 of FIG. 2c. As discussed above, where the sidewalls are tapered (i.e., vary as a function of height), the width of the post (Wp) is the maximum width thereof, and the width of diode structure 285 (Wd) is the maximum width thereof as shown in cross-sectional view 290. The taper exhibited by the sidewalls will vary dependent upon the processes and materials used for constructing post enhanced diodes 130 as is known in the art. Similar tapering may occur on the sides of wells 205. It should be noted that addition of the post to diode structure 285 results an asymmetry of forces generated by liquid movement around a plate diode between an inverted orientation and a non-inverted orientation. As such, the post need not be a perfectly vertical structure, but rather may be any structure sufficient to result in a net positive moment of force when post enhanced diode 210 is in an inverted orientation, and a substantially lower moment of force when post enhanced diode 210 is in a non-inverted orientation such that post enhanced diodes 210 will prefer a non-inverted orientation. In some cases, the depth of wells 205 is substantially equal to the height of diode structure 285 of each of the post enhanced diodes 210, and the inlet opening of wells 205 is greater that the width of diode structure 285 of each of the post enhanced diodes 210 such that only one post enhanced diode 210 deposits into any given well 205.

Once post enhanced diodes 210 are deposited in wells 205 with post 255 extending away from substrate portion 230, one or more electrical contacts in wells 205 are connected to one or more electrical contacts on bottom surface 275 of post enhanced diodes 210, and one or more processing steps are performed to electrically connect one or more electrical contacts on top surface 245 of post enhanced diodes 210 to controllable signals. Upon completion of such processing, post enhanced diodes 210 can be individually controlled causing a display including substrate portion 230 and post enhanced diodes 210 to display a desired image. Post enhanced diodes 210 as discussed herein may be used, among other things, to fabricate both direct emission displays and locally-addressed backlight units.

Getting post enhanced diodes positioned correctly in a pixel array and in a non-inverted orientation is considered one of the major technical challenges towards achieving a cost-effective design of a transparent display. Among other things, use of a post in relation to a diode enhances the likelihood of a non-inverted orientation of each disk that gets captured by a well. However, it is still possible for an inverted (i.e., post down) deposition of a post enhanced diode in a well. In some cases, such inverted depositions are caused by the post inserting into a through hole via, or adjacent to the edge of a well.

Some embodiments provide wells and vias on the glass substrate used to capture the microLED disks to achieve two main purposes. One is to make the face-down disk orientation less stable than with the standard well and via design and the other is to achieve an overall increase in disk capture efficiency. The standard design consists of circular wells with nonety (90) degree sidewall angles and circular vias centered on the wells. By changing the sidewall angle of the well, the position and size of the via, and the overall shape of the well, we can eliminate the stable configurations of the face-down disk and increase the percentage of correctly oriented disks. In general, the overall invention described here is the substrate geometry that enables efficient fluidic assembly of electronic devices through proper surface feature and via design.

As just some of many advantages, the improved capture efficiency and retention and the increase in percentage of face-up disks lead to: lower display costs, and increased manufacture throughput. The major cost of a microLED display is the material cost of the microLED disks themselves. With 90% selectivity, a redundant design is needed where several LEDs are coupled to produce a single pixel. Reducing the needed redundancy of microLEDs by further increasing the selectivity will dramatically reduce the cost. An alternative approach to redundancy is the use of more complex electronic circuits to drive LEDs that might be in different orientations. This becomes complex and adds costs. Increased throughput results in a reduction in assembly time. A requirement that every pixel operates correctly means the fluidic assembly must be continued until the face-down microLED disks are removed. Stable orientations of face-down disks require high flow rates to remove them. This also removes some of the face-up disks, requiring more time to re-capture the face-up disks. Eliminating the stable orientations of face-down disks means lower flow rates can be applied, so that face-up disks are not removed from the wells.

Various well and well features are discussed below in relation to FIGS. 3-8 that in some circumstances mitigate the possibility of trapping components in a given well with an undesirable orientation or increase in the efficiency of the diode capture and retention.

Figure 3A:
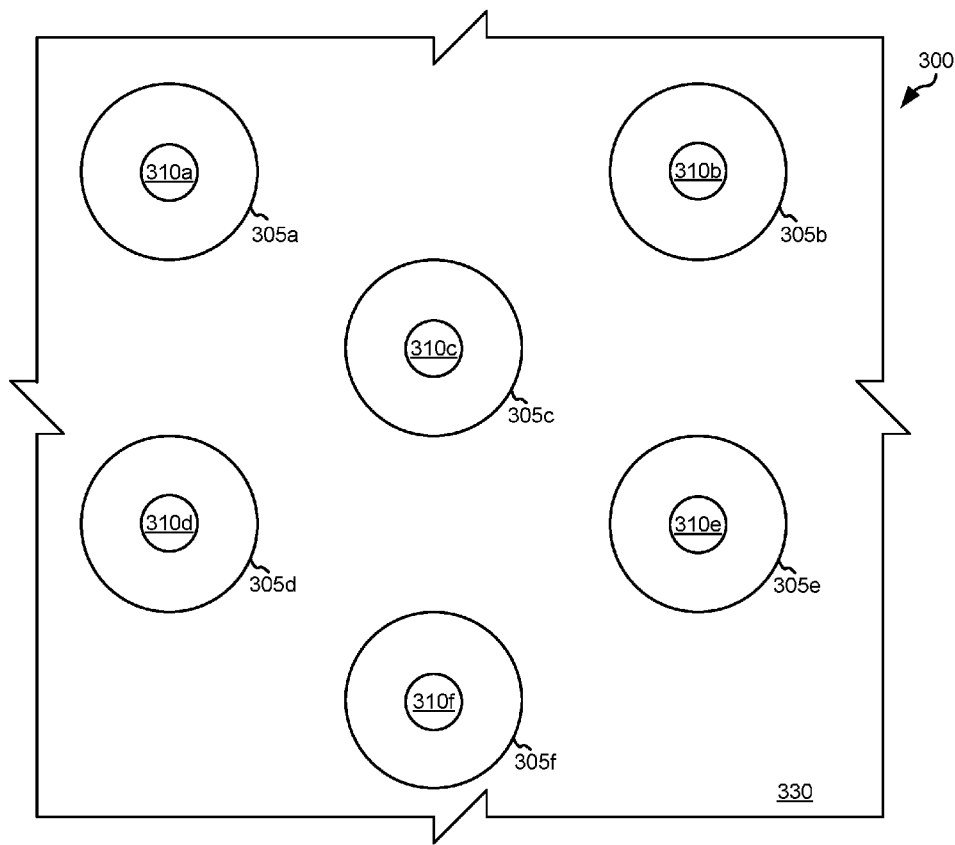
FIGS. 3a-3b show a substrate including a number of wells each including a centered through hole via in accordance with some embodiments of the present inventions.
Figure 3B:
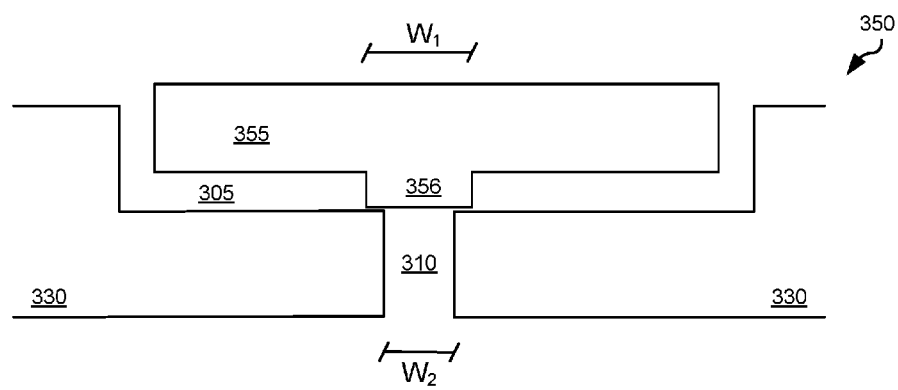

Turning to FIG. 3a, a top view 300 of a portion of a substrate 330 including a number of wells 305 each including centered through hole via 310 is shown in accordance with some embodiments of the present invention. Each of wells 305 is large enough to accommodate insertion of one post enhanced diode including a post 356 extending from a diode structure 355. As shown in a cross-sectional view 350 of FIG. 3b, in the case where post 356 extends from a central region of diode structure 355 and through hole via 310 extends from the center of well 305, a width ($W_1$) of post 356 is greater than a width ($W_2$) of through hole via 310. The presence of post 356 extending from the surface of diode structure 355 helps to flip the post enhanced diode when it is sitting in a well in an inverted orientation. Further, in some instances, through hole via 310 in well 305 allows a carrier liquid to be drawn through well 305. This drawing action of the carrier liquid operates to pull the post enhanced diode into well 305 in either an inverted or non-inverted orientation. By forming through hole via 310 with a width ($W_2$) that is less than the width ($W_1$) of post 356, post 356 is prevented from inserting into through hole via 310. Where, on the other hand, $W_2$ is not less than $W_1$, it would be possible for post 356 to become lodged in through hole via 310 making it very difficult to move an inverted post enhanced diode out of well 305.

Figure 4A:
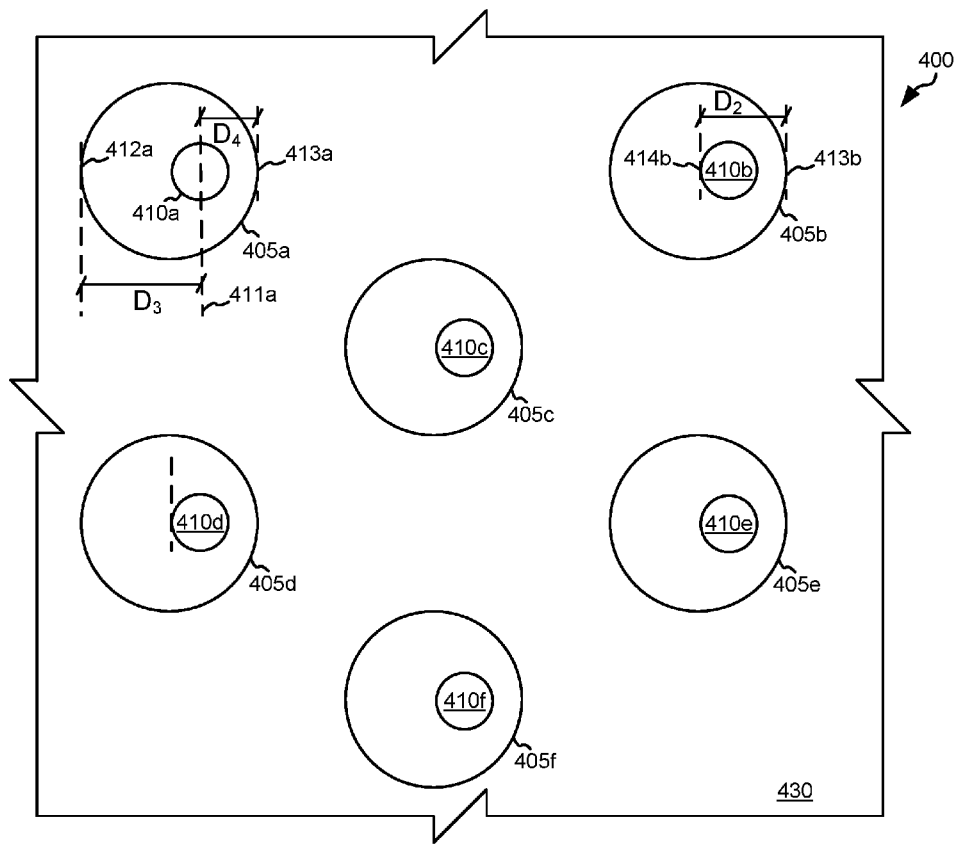
FIGS. 4a-4b show a substrate including a number of wells each including an off-center through hole via in accordance with various embodiments of the present inventions.

Turning to FIG. 4a, a top view 400 of a portion of a substrate 430 including a number of wells 405 each including an off-center through hole via 410 is shown in accordance with various embodiments of the present invention. Each of wells 405 is large enough to accommodate insertion of one post enhanced diode including a post 456 extending from a diode structure 455. A distance ($D_3$) from a center 411 of off-center through hole via 410 to a first side edge 412 of well 405 is greater than a distance ($D_4$) from center 411 to a second side edge 413. Another distance ($D_2$) extends from a far edge of through hole via 410 to second side edge 413

Figure 4B:
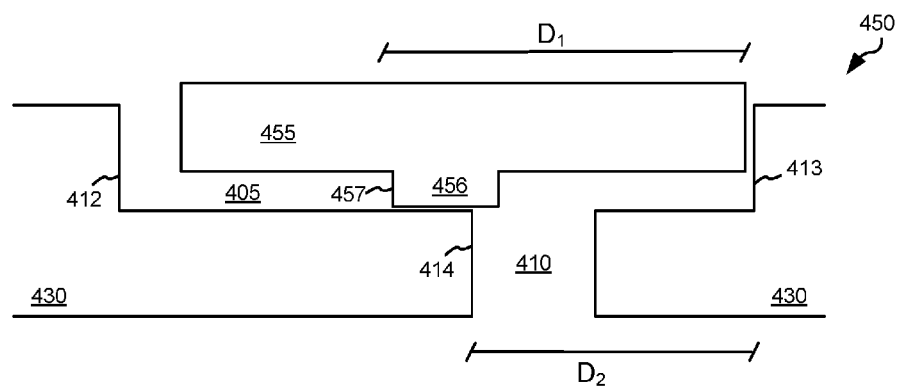

As shown in a cross-sectional view 450 of FIG. 4b, in the case where post 456 extends from a central region of diode structure 455 and through hole via 410 extends from a location off-center in well 405, a distance ($D_2$) from a far edge 414 of through hole via 410 to second side edge 413 of well 405 is greater than a distance ($D_1$) from a far edge 457 of post 456 to second side edge 413 of well 405. Again, the presence of post 456 extending from the surface of diode structure 455 helps to flip the post enhanced diode when it is sitting in a well in an inverted orientation, and in some instances through hole via 410 in well 405 allows a carrier liquid to be drawn through well 405. This drawing action of the carrier liquid operates to pull the post enhanced diode into well 405 in either an inverted or non-inverted orientation. By offsetting through hole via 410 from the center of well 405 while maintaining post 456 generally centered on diode structure 455, post 456 is prevented from inserting into through hole via 410 where $D_1$ is greater than $D_2$ even if the width of through hole via is large enough to accommodate post 456. Where, on the other hand, $D_1$ is not greater than $D_2$, it would be possible for post 456 to become lodged in through hole via 410 making it very difficult to move an inverted post enhanced diode out of well 405. By offsetting through hole via 410 from the center of well 405, a larger through hole via may be accommodated without resulting in the possibility of trapping post 456.

Simulations suggest that for a post enhanced diode traversing the surface of a substrate at a location almost fully over a well, a centered through hole via may not result in a substantial drag force from fluid flowing from the surface of the substrate through the through hole via moving the post enhanced diode into the well due in part to the relatively small via width compared with the via width achievable by using an off-center through hole via. In contrast, a larger width through hole via possible where the through hole via is off-center may result in a positive net force dragging the post enhanced diode into the well. Thus, in addition to mitigating the possibility of post insertion into a through hole via, use of a larger off-center through hole via may also enhanced the propensity of depositing a post enhanced diode in a well in a non-inverted orientation. It should be noted that while the embodiment of FIG. 4 includes an off-center through hole via and a substantially centered post, other embodiments where the through hole via is substantially centered and the post is off-center provide similar results. To generally describe both of the two off-center embodiments (i.e., a first using an off-center post and a second using an off-center through hole via), the through hole via is described as offset from the post. As used herein, the phrase "offset from a post" is used in its broadest sense to mean that the location of the through hole via is such that a wall of a well in which the through hole via is formed contacts a side of a post enhanced diode before a post of the post enhanced diode can insert into the through hole via.

Figure 5A:
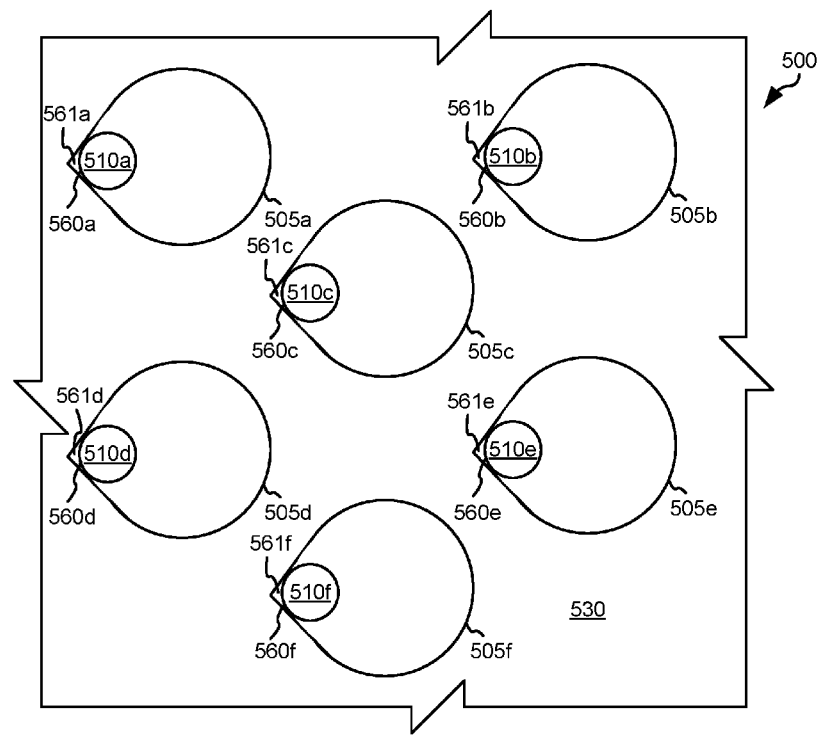
FIGS. 5a-5d depict a substrate including a number of wells each including an out of boundary through hole via in accordance with one or more embodiments of the present inventions.
Figure 5B:
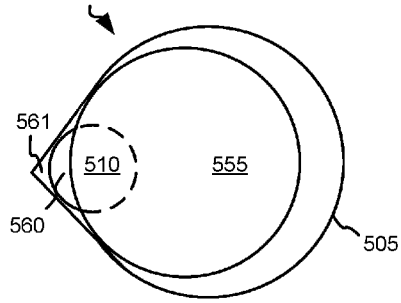
Figure 5C:
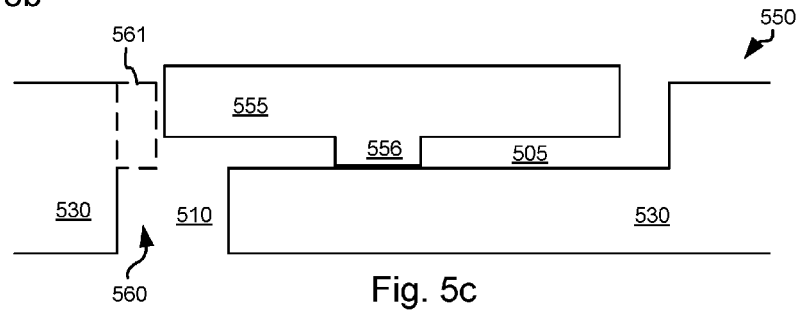

Turning to FIG. 5*a*, a top view 500 of a portion of a substrate 530 including a number of wells 505 each having a teardrop shape in accordance with one or more embodiments. Each of wells 505 is large enough to accommodate insertion of one post enhanced diode including a post 556 extending from a diode structure 555. Of note, the teardrop shape includes an out of boundary area 561 into which an out of boundary through hole via 510 extends. Out of boundary area 561 is defined as an area of a given well 505 that is not coverable by a post enhanced diode when that post enhanced diode is deposited in the well 505 such that the edges of the post enhanced diode touch the walls of the well 505 on either side of out of boundary through hole via 510. As shown in a top view 540 of a single well 505 of FIG. 5*b*, a portion 560 of each out of boundary through hole via 510 remains uncovered by a post enhanced diode (including diode structure 555) deposited in well 505 even when the post enhanced diode is moved to touch the walls of well 505 nearest out of boundary through hole via 510. A covered portion of out of boundary through hole via 510 is shown with a dashed line, while portion 560 is shown as a solid line. FIG. 5*c* shows a cross-sectional view 550 of well 505 depicted in FIG. 5*b*.

By setting out of boundary through hole vias 510 at least partially in a region not reachable by a deposited post enhanced diode, out of boundary through hole vias 510 can be formed with a width larger than post 556 without increasing the possibility of post 556 inserting into a given out of boundary through hole via 510. This increased size allows for fluid flows from a top surface of substrate 530 though out of boundary through hole vias 510 enhancing drag forces drawing post enhanced diodes into wells 505. Further, by assuring that at least a portion of out of boundary through hole vias 510 is not covered by a deposited post enhanced diode, at least some flow of the carrier liquid through the vias remains along with the corresponding drag forces even when a post enhanced diode is deposited in a given well 505.

It should be noted that while a teardrop shape is described, other shapes are possible that will result in an out of boundary area. For example, wells 505 may be formed in a hexagonal shape with an out of boundary through hole via formed near a point of the hexagon and touching adjacent facets of the hexagon. Such a configuration would provide at least a portion of an out of boundary through hole via that is not coverable by a circular post enhanced diode. Based upon the disclosure provided herein, one of ordinary skill in the art will recognize a variety of well shapes offering out of boundary regions that may be used in relation to different embodiments.

Figure 5D:
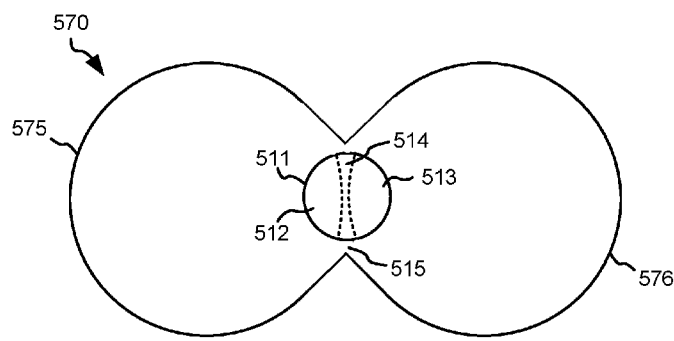

As another example, FIG. 5*d* shows a top view 570 of a dual well structure including a first well 575 having a teardrop shape and a second well 576 having the same teardrop shape rotated one hundred, eighty degrees. The teardrop shapes of first well 575 and second well 576 overlap such that an out of boundary area 515 is formed at the junction of the two wells. An out of boundary through hole via 511 is formed at the overlap with a first region 512 that can be covered by a post enhanced diode deposited in first well 575, a second region 513 that can be covered by a post enhanced diode deposited in second well 576, and a portion 514 that is not coverable by one or more post enhanced diodes deposited in either or both of first well 575 and/or second well 576. In some cases, first well 575 and second well 576 may exhibit different diameters and/or depths to enable capture of post enhanced diodes of different sizes and/or shapes. Further, such overlapping wells allow for close placement of post enhanced diodes in, for example, a given display pixel, and allows for disks to be readily captured from both sides of the via. Such a configuration is just one example where each well has access to a via, but the overall quantity of vias is less due to the sharing. In some cases, such a reduction in the number of vias may reduce the time required to produce the through hole vias in the substrate. In some cases, there may also be a through hole via within each of first well 575 and second well 576 in addition to out of boundary through hole via 511 that is shared by both wells. Further, it should be noted that while a dual well structure is discussed, that three or more wells may be incorporated into a multi-well structure in accordance with other embodiments.

Figure 6A:
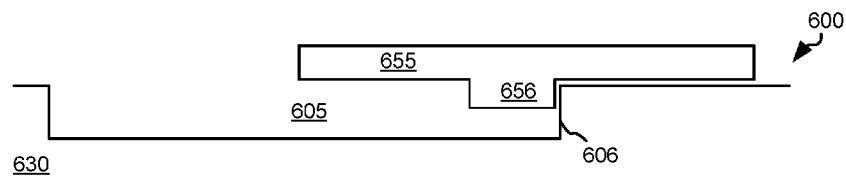
FIGS. 6a-6c each show a cross-section of a well having well walls in accordance with different embodiments of the present inventions.
Figure 6B:
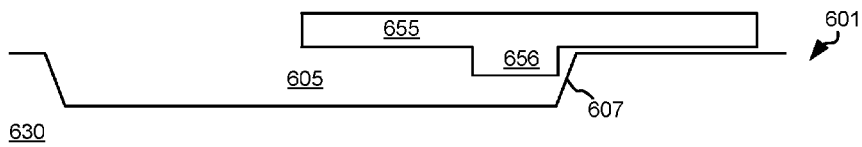
Figure 6C:
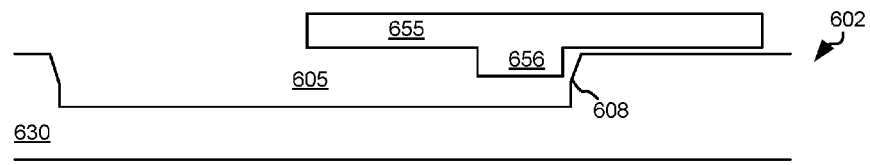

Turning to FIGS. 6*a*-6*c*, cross-sectional views 600, 601, 602 show sidewalls of wells that may be used in relation to different embodiments. In particular, cross-sectional view 600 shows a well 605 in a substrate 630 that is large enough to accept a post enhanced diode including a diode structure 655 and a post 656. Well 605 has sidewalls 606 that are substantially vertical. Such a vertical sidewall has the possibility of interlocking with post 656 as shown in a way that limits the ability of an inverted post enhanced diode to flip out of well 605. Such a limit may slow assembly time, or worse result in failure to deposit in one or more wells. In contrast, cross-sectional view 600 shows well 605 in substrate 630 modified to include an sloping sidewall 607. As used herein, the phrase "sloping sidewall" is used in its broadest sense to mean any wall where all or a part of the wall exhibits more than a twenty degree deviation from vertical. Such a sloping sidewall has less propensity to catch on post 656 than a corresponding vertical sidewall, and as such is less likely to limit flipping of an inverted post enhanced diode out of well 605. Cross-sectional view 600 shows well 605 in substrate 630 modified to include another type of sloping sidewall 608 that also reduces the propensity to catch on post 656 than a corresponding vertical sidewall, and as such is less likely to limit flipping of an inverted post enhanced diode out of well 605. The preferred angle of a sloped sidewall depends in part on the dimensions of post 656 and the sidewalls of post 656, and upon the depth of well 605. Selecting a sidewall angle and the depth to which the angled sidewall extends into well 605 is a balance between a desire to maintain propensity for non-inverted post enhanced diodes deposited in well 605 from escaping and a desire to destabilize inverted post enhanced diodes partially captured as shown in the figures. It should be noted that while examples of straight walls (both sloped and vertical) have been provided, that other embodiments may use sidewalls exhibiting some curvature. In some cases, the wall may be vertical in some areas and curved in others. In various cases, other complex and varying (non-symmetrical) curvature may be used.

Figure 7A:
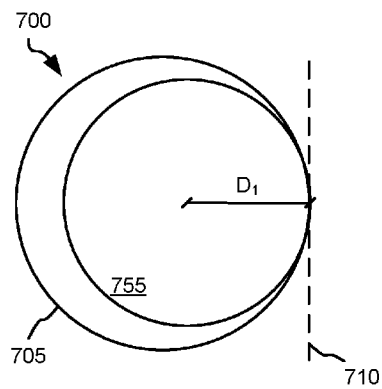
FIGS. 7a-7b show wells of differing geometric shapes each offering a different moment of inertia about an axis of rotation for an inserted diode in accordance with various embodiments of the present inventions.

Turning to FIG. 7a, a top view 700 shows a circular well 705 which is capable of accepting a single post enhanced diode 755. When deposited in well 705, a force required to flip post enhanced diode 755 out of well 705 is in part a function of a distance ($D_1$) from an axis of rotation 710, a depth of well 705, and whether post enhanced diode 755 is deposited in an inverted or non-inverted orientation. When in a non-inverted orientation, the force required to flip post enhanced diode 755 about axis 710 is greater than when post enhanced diode 755 is in an inverted orientation. As $D_1$ increases, the moment of inertia about axis 710 also increases, and where the depth of well 705 increases the effect of drag forces from the movement of the carrier liquid is reduced which causes an increase in the probability that post enhanced diode 755 will remain deposited in well 755.

Figure 7B:
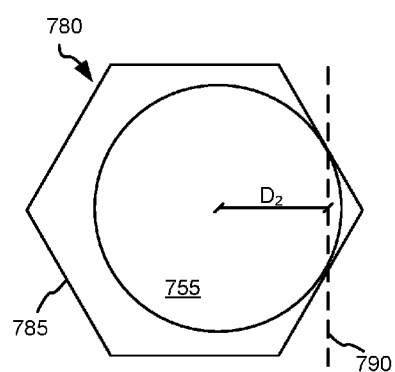

Turning to FIG. 7b, a top view 780 shows a hexagonal well 785 which is capable of accepting a single post enhanced diode 755. Similar to that discussed above in relation to FIG. 7a, when deposited in well 785, a force required to flip post enhanced diode 755 out of well 785 is in part a function of a distance ($D_2$) from an axis of rotation 790, a depth of well 785, and whether post enhanced diode 755 is deposited in an inverted or non-inverted orientation. By using a hexagonal shaped well as opposed to the circular well of FIG. 7a, an axis of rotation 720 is moved closer to the center mass of post enhanced diode 755. In particular, $D_2$ is less than $D_1$ for post enhanced diodes of the same size and shape. The depth of well 785 and orientation of post enhanced diode 755 being the same in both the case described in relation to FIG. 7a and the case described in relation to 7a, the moment of inertia about axis 790 is reduced such that less force is required to flip post enhanced diode 755 out of well 785 than that required to flip post enhanced diode 755 out of well 705 because of the reduction in distance.

Of note, other polygonal shapes will also shift the axis of rotation, although by a different amount depending upon the interaction between a circle and the particular polygon. Further, well depth may be any depth. As just some examples, well depth of 3 µm, 5 µm, or 10 µm. This ease of flipping a post enhanced diode out of a well can be quite sensitive to the depth of the well. Thus, in some embodiments, well depth may be initially selected as a means of coarse tuning with well shape being used as a means of fine tuning a force required to flip a post enhanced diode out of a given well.

Figure 8:
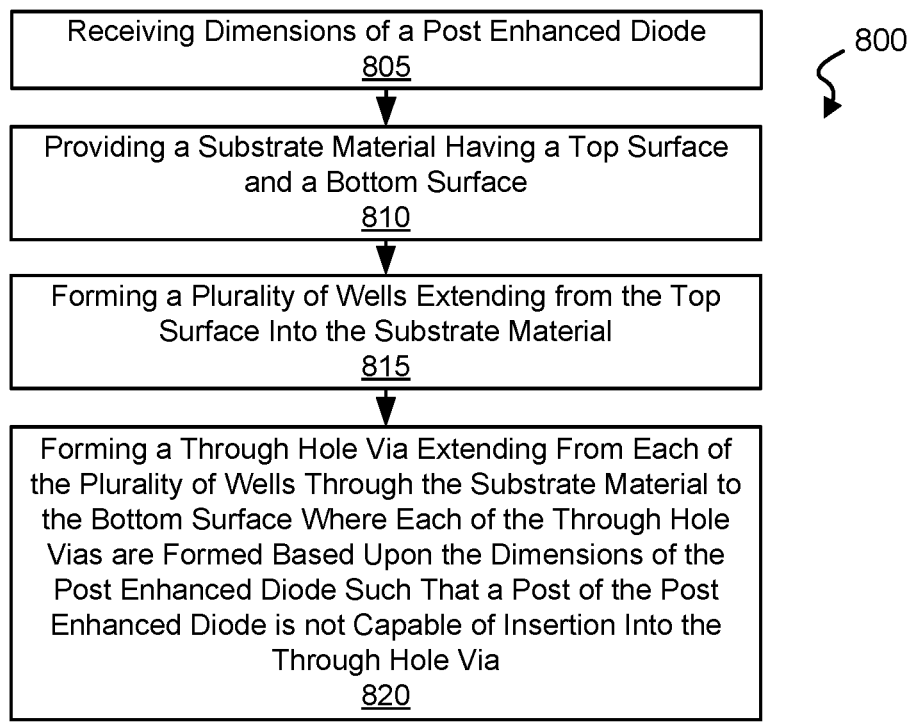
FIG. 8 is a flow diagram showing a method in accordance with some embodiments of the present inventions for making a substrate having a plurality of wells.

Turning to FIG. 8, a flow diagram 800 shows a method in accordance with some embodiments for making a substrate having a plurality of wells. Following flow diagram 800, dimensions of a post enhanced diode are received (block 805). These dimensions may include, but are not limited to, a width and a height of a diode structure of the post enhanced diode, a width and a height of a post of the post enhanced diode, and an offset of the post from a center of the diode structure. A substrate material is provided that includes a top layer and a bottom layer (block 810). A plurality of wells are formed in the substrate material that extend from the top surface of the substrate material into the substrate material (block 815). These wells may be formed using any technique known in the art for forming a depression in a substrate including, but not limited to, a patterned etch process. A through hole via is formed extending from the bottom of each of the plurality of wells (block 820). The through hole vias extend from the bottom of the respective wells through the substrate material and out the bottom surface of the substrate material.

The size and/or location of the through hole vias is determined based upon the received dimensions of the post enhanced diode, with the size and/or location being selected to prevent a post of the post enhanced diode from inserting into the through hole via. For example, the size of the through hole via may be selected such that it is too small for the post to insert similar to that discussed above in relation to FIGS. 3a-3b. As another example, the location of the through hole via relative to the bottom of a given well may be selected such that the through hole via is offset from the post such that when the post enhanced diode is deposited in a given well in an inverted orientation the post is incapable of insertion in the through hole via similar to that discussed in relation to FIGS. 4-5.

It should be noted that the description of surface features and via geometries presented herein are not exhaustive, but rather represent representative of certain types of structures that are beneficial in various fluidic assembly processes. In some cases, it is possible to have wells or other fluidic structures on both major surfaces of a substrate to enable fluidic assembly of electronic elements on both sides of the substrate. In various cases, the substrate may have some well structures with associated through hole vias and other well structures without associated through hole vias in such a way that would enable some well structures to be used purely for re-orientating deposited devices prior to being secured in a final position. The benefit of the well modifications discussed herein may be applicable to various fluidic assembly approaches including, but not limited to, simple unidirectional flow, oscillatory flow, or mechanically aided flow such as with a brush.

In conclusion, the invention provides novel systems, devices, methods and arrangements for fluidic assembly. While detailed descriptions of one or more embodiments of the invention have been given above, various alternatives, modifications, and equivalents will be apparent to those skilled in the art without varying from the spirit of the invention. For examples, while some embodiments are discussed in relation to displays, it is noted that the embodiments find applicability to devices other than displays. Therefore, the above description should not be taken as limiting the scope of the invention, which is defined by the appended claims.

What is claimed is:

1. A fluidic assembly system, the system comprising:
    a substrate including a plurality of wells each having a sidewall and a first width, wherein a through hole via extends from a bottom of at least one of the plurality of wells;

a post enhanced diode including a post having a second width and extending from a top surface of a diode structure, and wherein the diode structure has a third width; and wherein the first width is greater than both the second width and the third width, and wherein the post of the post enhanced diode is incapable of insertion in the through hole via.

2. The system of claim 1, wherein a width of the through hole via is less than a width of the post.

3. The system of claim 1, wherein the through hole via is offset from the post such that when the post enhanced diode is deposited in the well in an inverted orientation the post is incapable of insertion in the through hole via.

4. The system of claim 3, wherein the through hole via is offset from a center location of the bottom of the at least one of the plurality of wells.

5. The system of claim 3, wherein the post is offset from a center location of the top surface of the diode structure.

6. The system of claim 1, wherein the through hole via extends from an out of boundary area of the at least one of the plurality of wells, wherein the out of boundary area incapable of being fully covered by the diode structure when the post enhanced diode is deposited in the well in a non-inverted orientation.

7. The system of claim 6, wherein the well has a tear drop shape including a circular region and a triangular region, and wherein the out of boundary area includes a portion of the triangular region.

8. The system of claim 1, wherein the sidewall is a sloping sidewall.

9. The system of claim 1, wherein the at least one of the plurality of wells has a polygonal shape.

10. The system of claim 1, wherein the at least one of the plurality of wells is a first well, and wherein the first well is joined with a second well to make a multi-well structure, and wherein the post enhanced diode may be deposited in a non-inverted orientation in the first well such that it cannot move into the second well without being completely removed from the first well.

11. The system of claim 1, wherein the at least one of the plurality of wells is a first well, and wherein the first well is joined with a second well to make a multi-well structure, and wherein the post enhanced diode may be deposited in a non-inverted orientation in the first well but is incapable of being deposited in the second well in the non-inverted orientation.

12. A fluidic assembly system, the system comprising:
a substrate including a plurality of polygonal wells, wherein each of the polygonal wells have a sidewall defining an outer perimeter of the respective polygonal well and extending from one surface of the substrate to a well bottom, wherein the outer perimeter is a polygon shape, and wherein each of the polygonal wells is sized to accept a single disk shaped device.

13. The system of claim 12, wherein the disk shaped device is a diode structure.

14. The system of claim 12, wherein the side wall of at least one of the polygonal wells is a sloped sidewall that differentially limits removal of the disk shaped device from the well depending upon orientation of the disk shaped device.

15. A method for forming a fluidic assembly substrate, the method comprising:
receiving a post dimension of a post enhanced diode;
providing a substrate material having a top surface and a bottom surface;
forming a plurality of wells in the substrate material, wherein each of the plurality of wells extends only partially into the substrate material, wherein a through hole via extends from a bottom of at least one of the plurality of wells through to the bottom surface of the substrate material; and wherein the through hole via is formed based upon the post dimension such that a post of the post enhanced diode is incapable of insertion into the through hole via.

16. The method of claim 15, wherein a width of the through hole via is less than a width of the post.

17. The method of claim 15, wherein the shape of the at least one of the wells is polygonal.

18. The method of claim 15, wherein the through hole via is located between two adjacent facets of a polygon forming a sidewall of the well.

19. The method of claim 15, wherein the through hole via extends from an out of boundary area of the at least one of the plurality of wells, and wherein the out of boundary area is incapable of being fully covered by a circular disk deposited in the well.

20. The method of claim 19, wherein the well has a tear drop shape including a circular region and a triangular region, and wherein the out of boundary area includes a portion of the triangular region.

* * * * *